(12) United States Patent  
Rahn

(10) Patent No.: US 7,271,390 B2
(45) Date of Patent: Sep. 18, 2007

(54) IMAGING SYSTEMS AND METHODS INCLUDING AN ALTERNATING PIXEL ARRANGEMENT

(75) Inventor: Jeffrey T Rahn, Mountain View, CA (US)

(73) Assignee: Palo Alto Research Center, Incorporated, Palo Alto, CA (US)

( * ) Notice: Subject to any disclaimer, the term of this patent is extended or adjusted under 35 U.S.C. 154(b) by 160 days.

(21) Appl. No.: 11/012,486

(22) Filed: Dec. 16, 2004

(65) Prior Publication Data

US 2006/0131507 A1 Jun. 22, 2006

(51) Int. Cl.
*H01L 27/146* (2006.01)
(52) U.S. Cl. .................................. 250/370.09
(58) Field of Classification Search ............ 250/370.09
See application file for complete search history.

(56) References Cited

U.S. PATENT DOCUMENTS 6,903,716 B2 * 6/2005 Kawabe et al. ............... 345/99
2002/0053946 A1 * 5/2002 Huang ........................ 330/127
2003/0001222 A1 1/2003 Street et al.
2005/0078252 A1 * 4/2005 Lin ............................. 349/139

* cited by examiner

Primary Examiner—David Porta
Assistant Examiner—Mindy Vu
(74) Attorney, Agent, or Firm—Oliff & Berridge, PLC

(57) ABSTRACT

An imaging system includes a plurality of gate lines, a plurality of data lines, a common ground line, a plurality of capacitors and an array of pixels that are alternately arranged so that the common ground line is shared by the plurality of capacitors and shared by at least two rows or columns of pixels. A method of forming an array of pixels in an imaging system includes forming a plurality of gate lines, forming a plurality of data lines, forming a common ground line, forming a plurality of capacitors and forming the array of pixels to be alternately arranged so that the common ground line is shared by the plurality of capacitors and shared by at least two rows of pixels.

20 Claims, 5 Drawing Sheets

IMAGING SYSTEMS AND METHODS INCLUDING AN ALTERNATING PIXEL ARRANGEMENT

This invention was made with United States Government support under Agreement No. 70NANB7H3007 awarded by NIST. The United States Government has certain rights in this invention.

BACKGROUND OF THE INVENTION

1. Field of Invention

The invention relates to imaging systems and methods. More specifically, the invention relates to imaging systems and methods that may include an alternating pixel arrangement.

2. Description of Related Art

Two-dimensional amorphous silicon (A—Si:H) sensor arrays are well-known devices for real time imaging of incident high energy radiation (see R. A. Street et al., "Large Area Image Sensor Arrays", in Technology and Applications of Amorphous Silicon, Editor R. A. Street, Springer Series in Materials Science 37, Springer-Verlag, Berlin, 2000, chapter 4, p. 147, for a general description of the structure of the arrays). Such sensor arrays are particularly advantageous for X-ray imaging because they present a relatively large size image sensor array. Each sensor operates on the principal of integrating a charge representative of the quantities of ionizing radiation incident on the sensor. In the direct detection approach, incident high-energy radiation (e.g., X-ray photons) is directly converted to a charge by the sensor (using materials such as $PbI_2$ or Se). In the indirect detection approach, a phosphor converter absorbs high energy radiation (e.g., X-ray photons) and generates a proportional amount of visible light that is then converted to a charge by the sensor.

To minimize the X-ray dose to patients during medical imaging, there is a need for a—Si:H sensor arrays having the highest possible signal-to-noise ratio. In general, the signal-to-noise ratio of an image sensor array is limited by the electronic noise generated in the array, particularly for imaging conditions when the X-ray dose is low. There are a number of sources of this electronic noise in an image sensor array. A first source is generated by the resistance of the thin-film transistor (TFT) utilized to access the individual image sensors during readout, combined with the sensor capacitance, which gives a noise power of $2\,kTC_s$ (where k is the Boltzmann constant, T is temperature in degrees Kelvin, and $C_p$ is the pixel capacitance). A second source is data line capacitance $C_D$, which acts on the input of the readout amplifiers of the image sensor array to contribute a noise of $N_0 + \beta C_D$, where $N_0$ is typically 200 electrons and $\beta$ is the noise slope of about 15 e.$^-$/pF. A third source is generated by thermal noise of the data line resistance, which can be represented by $4\,kTR_D \Delta f$, where $R_D$ is data line resistance, and $\Delta f$ is typically 1 MHz, but depends on the speed of the readout amplifier. A fourth source of electronic noise is line-correlated noise that is capacitively coupled from the gate and bias line power supplies to the data line, and is proportional to the data line capacitance.

Of the various sources of electronic noise in large area and high-resolution image sensor arrays, data line capacitance tends to be the largest noise source, since it is proportional to the very large number of pixels (i.e., individual sensors and associated TFTs) coupled to each data line. For a typical array, the data line capacitance per pixel is 30-50 fF, which gives a total capacitance of about 100 pF, and an amplifier noise of about 1700 electrons. The kTC noise of each sensor is typically in the range of 300-600 electrons, depending on the size of the pixel, and the thermal noise of the data line can be made small by choosing a low resistance metal and limiting the amplifier bandwidth. The line-correlated noise can be minimized by very careful design of the power supplies, but for very large arrays is about 1000 electrons.

With these parameters, data line capacitance becomes the most significant source of electronic noise, and a reduction in the data line capacitance could significantly reduce the electronic noise, which would also reduce the requirements for very high performance readout amplifiers and very low noise power supplies. Most importantly, reducing the noise produced by reducing data line capacitance would increase the signal-to-noise ratio of the sensor array, thereby facilitating medical imaging using lower X-ray doses.

While the sensor capacitance can be a source of noise, it also serves an essential role in keeping the bias voltage across the sensor constant. As photocurrent is integrated across the sensor, the bias voltage drops until the sensitivity goes to zero. In addition, the voltage difference on adjacent pixels increases, which might cause leakage between adjacent pixels. Since imaging applications demand high dynamic range, the sensor capacitance is a crucial design criteria. For indirect-detection arrays, a thin photoconductor might provide sufficient pixel capacitance $C_p$ to accumulate the charge. The sufficiency depends on the material properties of the photoconductor, primarily the absorption length of visible light. Amorphous silicon has a short absorption length, and typically a thin layer of this material can act as the pixel capacitor as well as the sensor. Crystalline silicon, in contrast, would need to be thick and would not have sufficient intrinsic capacitance. For direct-detection, however, the absorption of length of x-rays in the clinically useful energy range is large even for high-atomic number materials.

The photoconductor layer must be thick in this case in order to ensure high sensitivity. Consequently, the intrinsic capacitance of the photoconductor is unlikely to be sufficient. Adding a capacitor to each pixel in parallel with the sensor capacitance will boost the capacitance $C_p$. This addition requires an additional ground connection to each pixel. If the ground connection is disposed parallel to the gate connections, then the data line must cross over a wire on the gate metal level double the amount of times. This configuration may add to the capacitance coupling between the data line and ground. If the ground connection is disposed parallel to the data connections, glitches from the switching signal may couple onto the sensor, introducing additional line-correlated noise.

Accordingly, what is needed is an image sensor that significantly reduces data line capacitance, and possibly reduce data line resistance, to significantly increase the signal-to-noise ratio of the sensor array.

SUMMARY OF THE INVENTION

Based on the problems discussed above, an imaging system includes a plurality of gate lines, a plurality of data lines, a common ground line, a plurality of capacitors and an array of pixels that are alternately arranged so that the common ground line is shared by the plurality of capacitors and shared by at least two rows or columns of pixels.

A method of forming an array of pixels in an imaging system includes forming a plurality of gate lines, forming a plurality of data lines, forming a common ground line, forming a plurality of capacitors and forming the array of pixels to be alternately arranged so that the common ground line is shared by the plurality of capacitors and shared by at least two rows or columns of pixels.

By reducing the number of crossovers between data and ground lines, the data line capacitance may be reduced proportionally. This reduction in capacitance will reduce the noise sources described above, thus improving the signal-to-noise ratio of the imager.

BRIEF DESCRIPTION OF THE DRAWINGS

Various exemplary embodiments of the systems and methods according to the invention will be described in detail, with reference to the following figures, wherein.

DETAILED DESCRIPTION OF PREFERRED EMBODIMENTS

The invention relates to imaging systems and sensors that may include an alternating pixel arrangement. For reasons of convenience, the examples below will be discussed using a medical X-ray imaging system. However, it should be appreciated by one skilled in the art that the systems and methods of the invention may be used with any known imaging system without departing from the spirit and scope of the invention.

Figure 1:
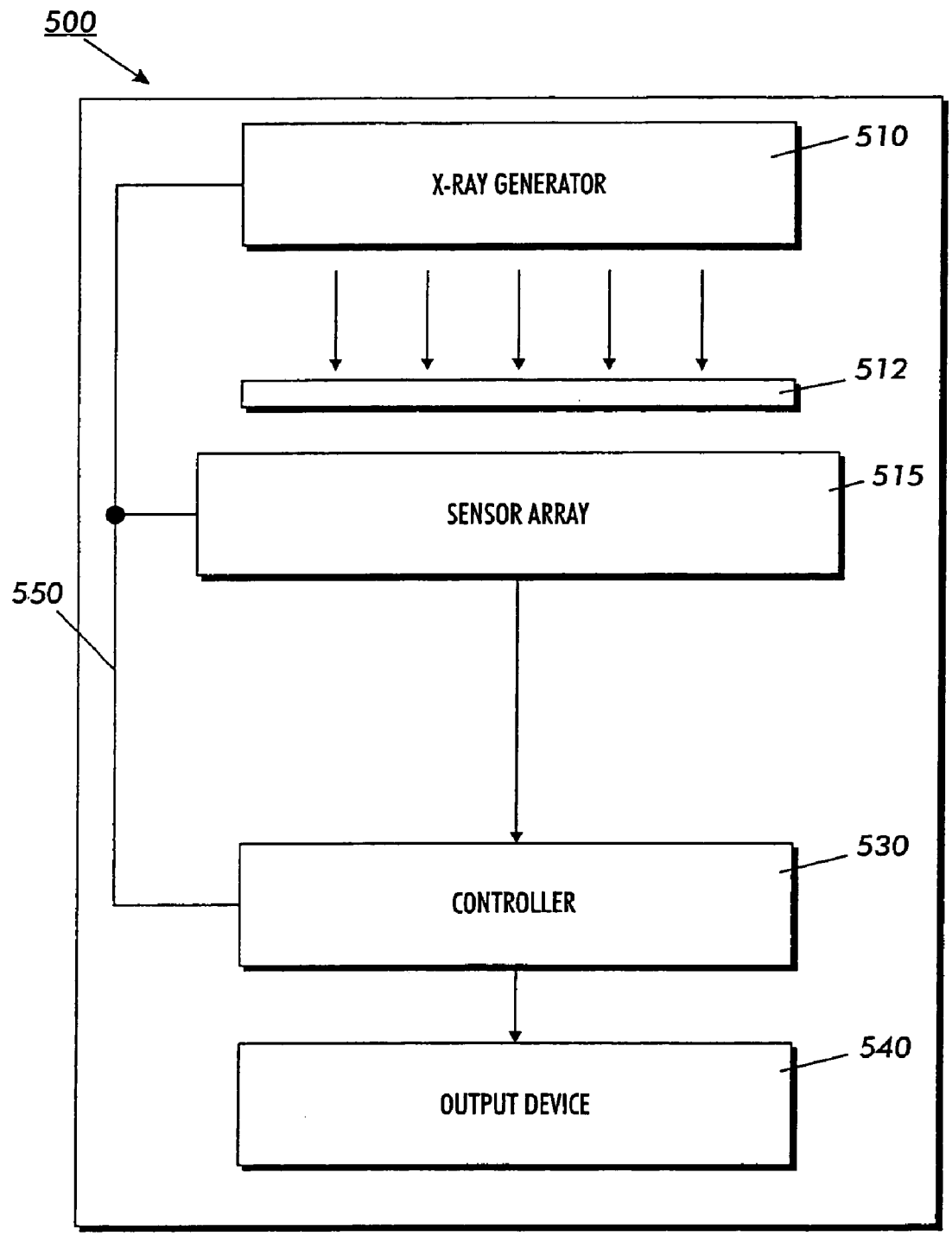
FIG. 1 is an exemplary diagram showing an imaging system.

FIG. 1 is an exemplary diagram showing an imaging system 500 in accordance with the invention. As shown in FIG. 1, the imaging system 500 may include an X-ray generator 510, sensor array 515, controller 530 and output device 540 which may all be connected via links 550. The X-ray generator 510 may be any device that is controlled by the processor 530 to generate X-rays towards the sensor array 515 to capture an image of an object 512. The sensor array 515 may include several layers of material that form the cell circuitry. The sensor array 515 may be any device that detects the X-rays and converts them into electrical signals that are used to form the image of the object 512. The electrical signals may be stored in the cell circuitry. The sensor array 515 may be controlled by the controller 530 to convert the electrical signals into the image of the object 512 after the object 512 has been positioned, for example, in between the X-ray generator 510 and the sensor array 515. The controller 530 may then control the stored electrical signals to be outputted to the output device 540. The controller 530 may be any known device used in processing images. For example, the controller 530 may processes analog or digital signals to form the image. The output device 540 may be, for example, a printer, a display monitor or any other known device used to record or display data.

Figure 2:
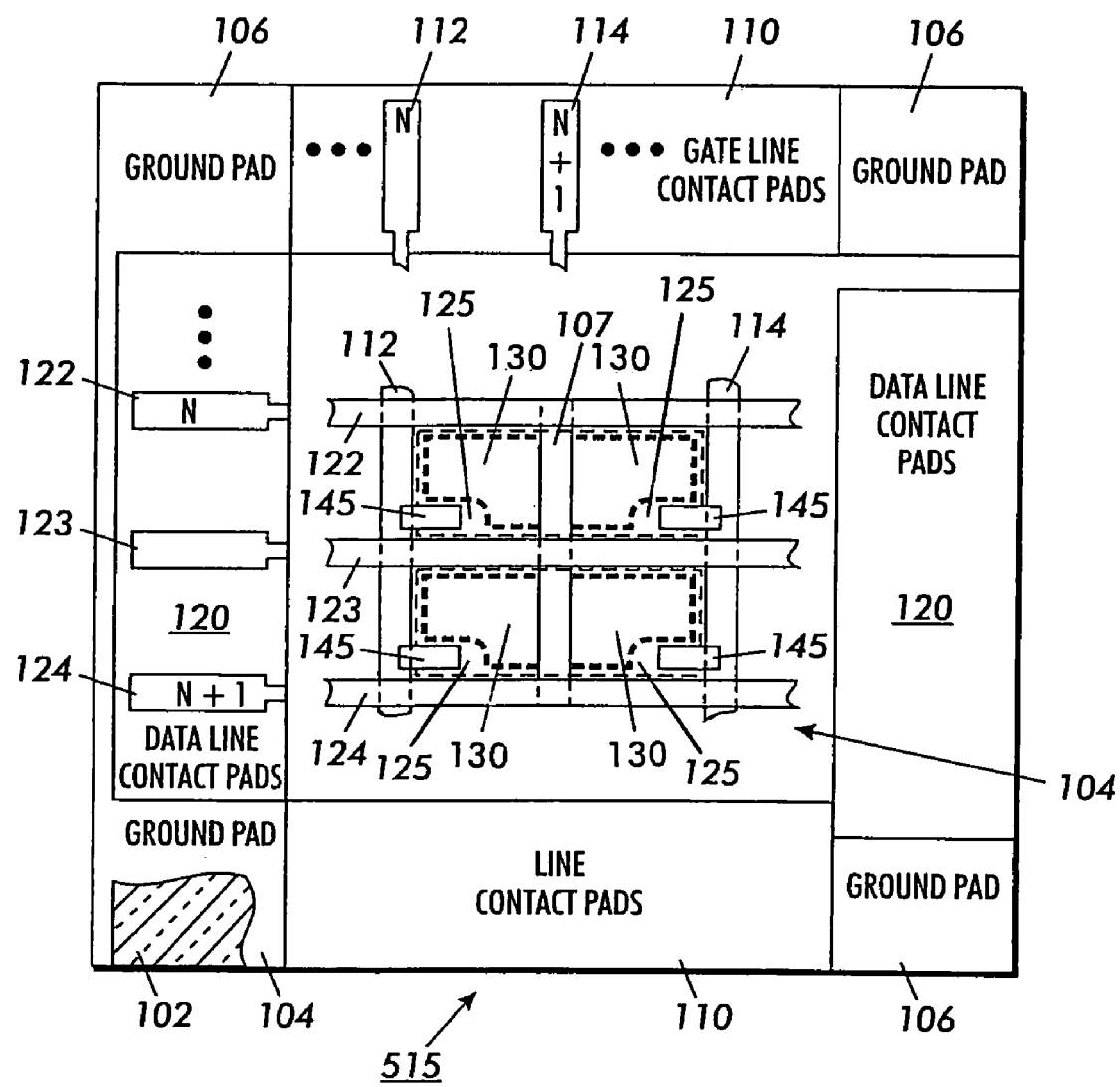
FIG. 2 is an exemplary diagram showing a sensor array that may be used in the imaging system in FIG. 1.

FIG. 2 is an exemplary detailed diagram showing a sensor array 515 that may be used in an imaging system shown in FIG. 1. The array circuitry in the figures uses two rows and columns of pixels, e.g., 2×2, for exemplary reasons only. However, it should be appreciated that any number of pixel rows and columns may be used without departing from the spirit and scope of the invention. As shown in FIG. 2, the sensor array 515 may include a substrate 102 with an array circuitry 104 and several kinds of peripheral circuitry, including ground pads 106, one at each corner of the substrate 102. The peripheral circuitry may also include gate line contact pads 110 at the upper and lower sides of array circuitry 104. The contact pads shown in FIG. 2 show mth gate line 112 and (m+1)th gate line 114 for exemplary reasons only. The peripheral circuitry may also include data line contact pads 120 at the left and right sides of array circuitry 104. FIG. 2 shows the contact pads for nth data line 122 and (n+1)th data line 123 for exemplary reasons only. FIG. 2 also shows that the array circuitry 104 may include switching elements 145 such as TFTs, e.g., amorphous silicon TFTs, or other types of switching elements with channels formed of other material. FIG. 2 also shows additional storage capacitors 130 formed within each cell. A sensor may be formed over the array circuitry 104 to include a layer (or multiple layers) of an indirect detection or direct detection photoconductor.

FIG. 2 also shows a common ground line 107 that may disposed across the data lines 122-124 and parallel to the gate lines 112 and 114. Additional storage capacitors 130 may be positioned within each pixel area 125, and each of the capacitors 130 may share the common ground line 107. The common ground lines 107 may be shunted together at the periphery of the substrate 102 to connect to the ground pad 106. The sensor used in the imaging system may be a direct-detecting or indirect-detecting material formed above the array circuitry. If a direct-detecting material is employed, it may be $PbI_2$ or Se or any other material sensitive to X-rays. If an indirect-detecting material is employed, it may be an amorphous silicon photodiode. If a semiconducting material is employed, the sensor may be a diode structure formed using an n-type silicon layer, a p-type silicon layer, and an intrinsic (or undoped) layer, forming a p-i-n junction between the p-type silicon layer and the n-type silicon layer. The electrical charge stored in the sensor may be read out using conventional TFT switches and charge-sensitive amplifiers.

Figure 3:
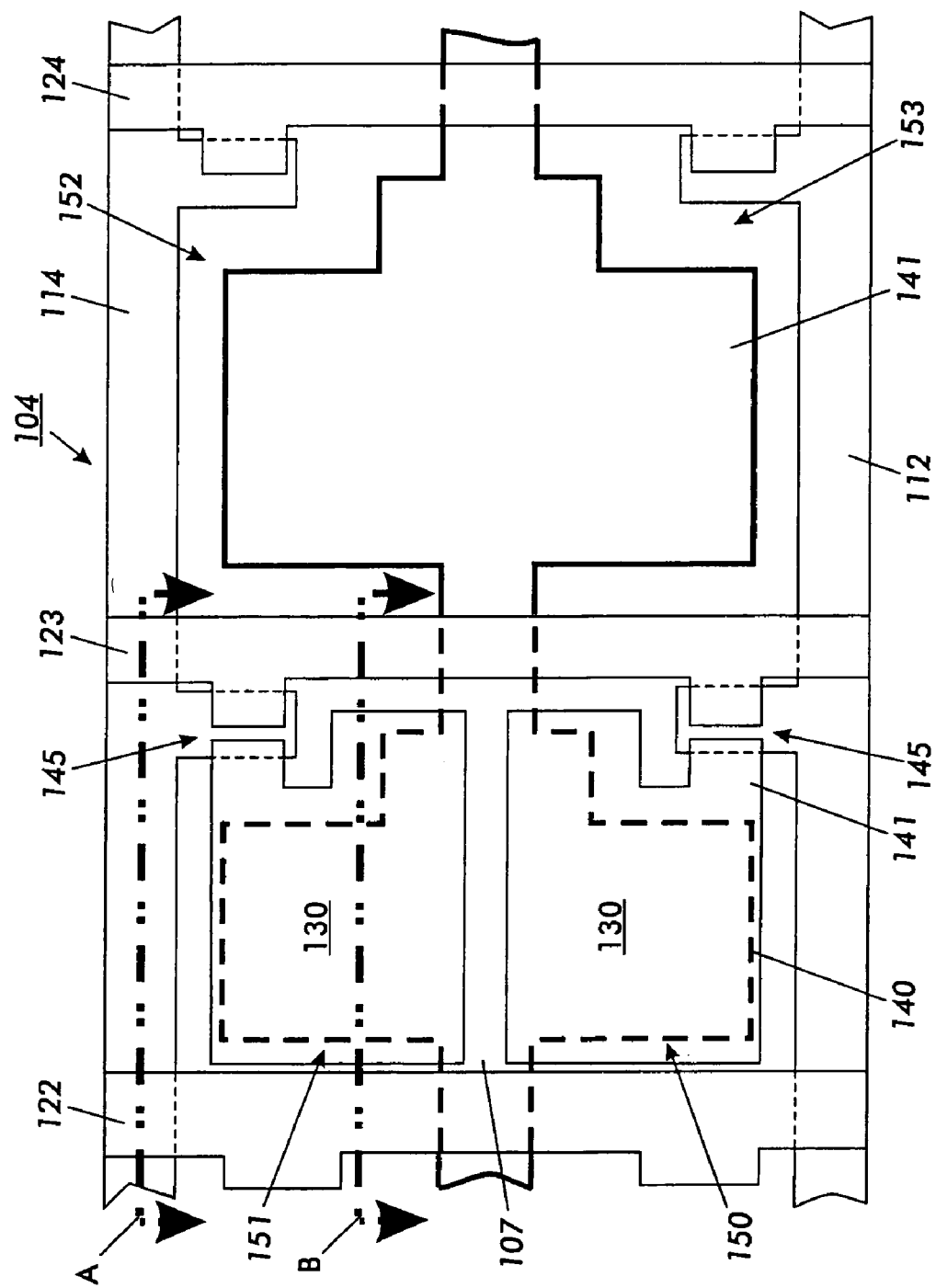
FIG. 3 is an exemplary detailed diagram of the sensor array circuitry shown in FIG. 2.

The layout shown in the array circuitry in FIG. 3 may be formed of pixels using an alternating arrangement. For example, the array circuitry 104 may be formed using the plurality of capacitors and the plurality of gate lines to form a metal layer. Moreover, the a second metal layer 141 may be formed over the first metal layer 140 to form the capacitor 130. The capacitance may be determined in part by the size of first layer 140 and may be selected to facilitate either radiographic or fluoroscopic imaging operations. The first layer 140 may be formed using the first metal layer that is used to form the gate line 112, or the second metal layer that is used to form the data lines 122 and 123. FIG. 3 shows the data lines 122-124 having three crossovers, e.g., over the gate lines and common ground line 107, for the two rows of pixels. The pixel orientation is alternated so that the common ground line 107 may be shared by the capacitors 130 and shared between two rows of pixels. Each individual pixel area 150-153 may be defined by regions formed by crossovers created by at least two data lines, e.g., 122 and 123, a gate line, e.g., 114, and the common ground line 107. Each pixel area 150-153 may have one of the capacitors 130 formed by the overlap of the first and second metal layers 140-141. When the gate is activated, the electrical charge is released from the capacitor 130 and flows from the drain of the switch 145 to the data line Using this alternating arrangement, the number of crossovers used in the array circuitry may be reduced. Moreover, the reduced number of crossovers permits wider data lines, which may reduce data line resistance. Furthermore, the number of ground connections required for the capacitors is reduced since they share a common ground. Accordingly, the amount of undesirable noise existing in the imaging system may be reduced.

Figure 4:
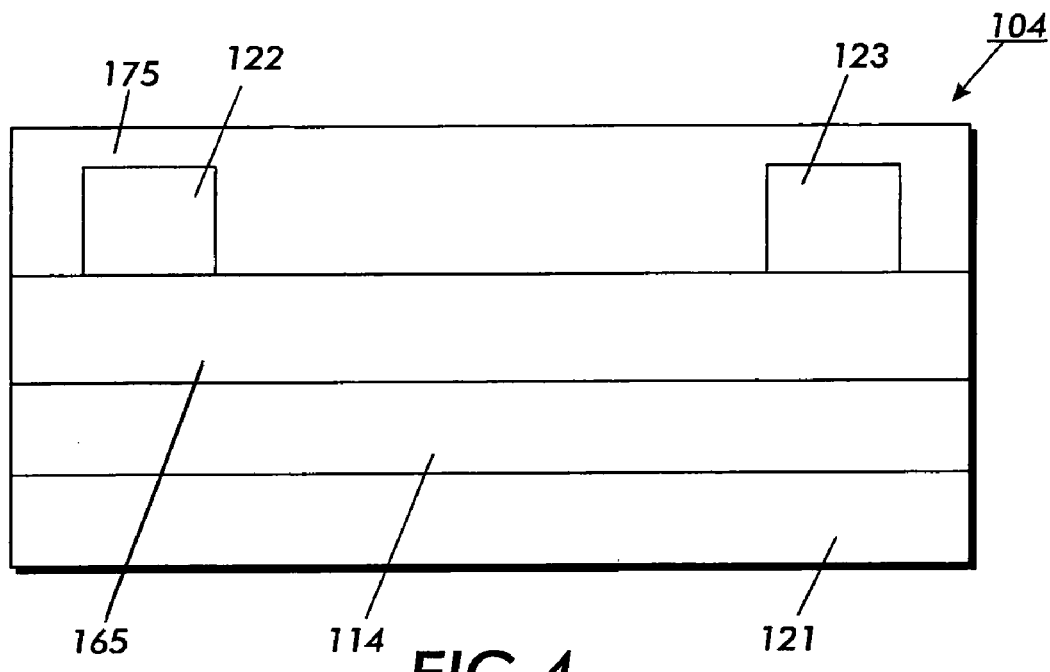
FIG. 4 is an exemplary detailed cross-sectional diagram of the sensor array circuitry.

FIG. 4 shows an exemplary detailed cross-sectional diagram from line A of the sensor array circuitry 104 shown in FIG. 3. As shown in FIG. 4, the array circuitry 104 may include a substrate 121, the gate line 114, a first dielectric layer 165 and the data lines 122 and 123. The substrate 121 may be formed of glass, silicon, quartz, or other suitable material. The gate lines 112 may be formed of a metal layer such as Cr or another suitable metal. Specifically, the gate line 114 may be formed by depositing a first metal layer, patterning the first metal layer, and then etching according to known techniques. The first dielectric layer 130 may be formed and may be composed of, for example, silicon nitride. The data lines 122 and 123 may then be formed such that each data line extends over the gate line 114 at corresponding crossover locations. The data lines 122 and 123 may be formed by depositing and patterning a second metal layer (e.g., TiW), and then etching the second metal layer using known techniques. A second dielectric layer 175, e.g., silicon nitride, may then be formed over the data lines 122 and 123 and the second metal layer 141 to insulate the data lines from the sensor. The sensor 180 may be formed over the second metal layer 141 and the second dielectric layer 175.

Figure 5:
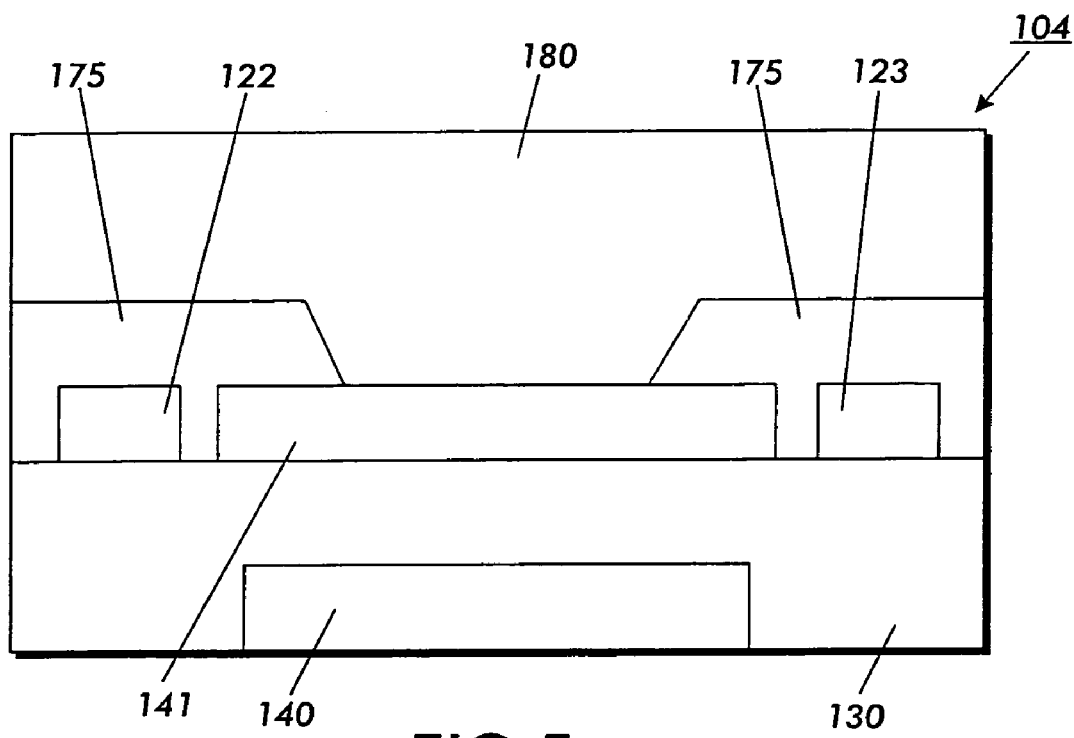
FIG. 5 is another exemplary detailed cross-sectional diagram of the sensor array circuitry.

FIG. 5 shows another exemplary detailed cross-sectional diagram from line B of the sensor array circuitry 104 shown in FIG. 3. The substrate 121 is omitted from FIG. 5 for reasons of convenience. As shown in FIG. 5, the array circuitry 104 may include the common ground 107, the first dielectric layer 165, a second metal layer 141, the data lines 122 and 123, a second dielectric layer 175 and a sensor 180. The second metal layer 141 may be used to form the data lines 122 and 123. The common ground 107 may be formed as part of the first metal layer 140. The additional pixel capacitor may be formed by the overlap of the first metal layer 140 and second metal layer 141. A via may be cut in the second dielectric layer 175 to allow contact between the sensor 180 and the second metal layer 141. This may consist of one large via or multiple small vias as is appropriate for the processing technology employed.

Figure 6:
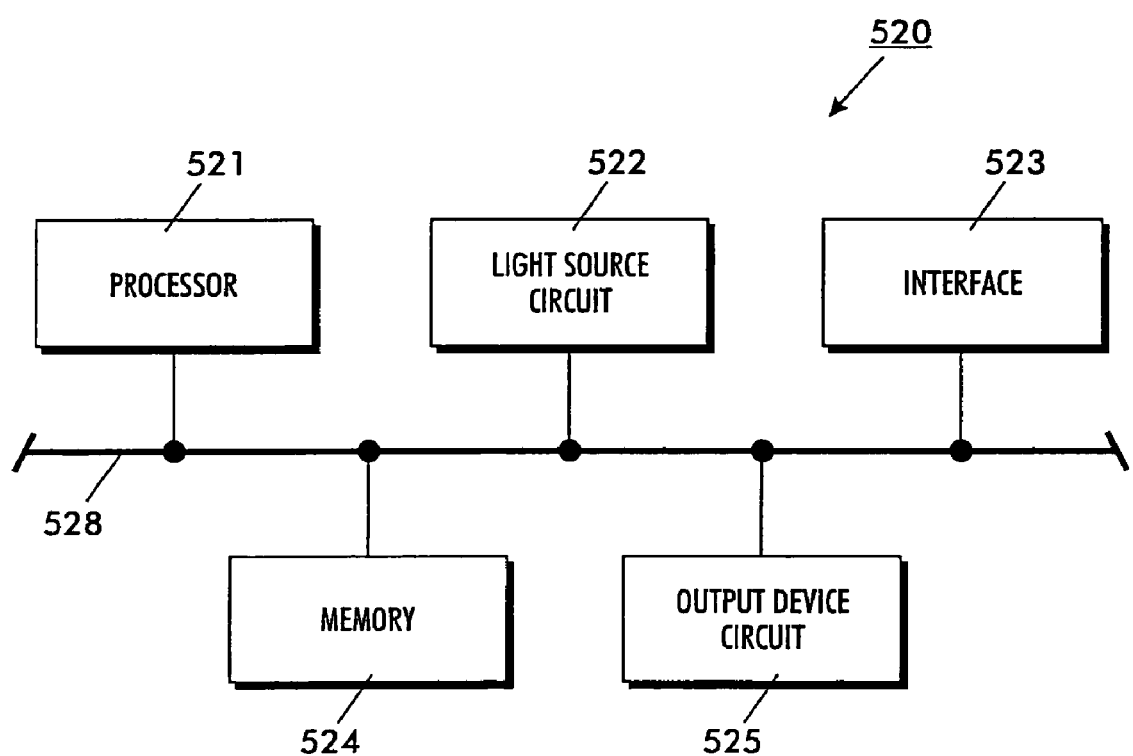
FIG. 6 is an exemplary detailed diagram of the controller shown in FIG. 1.

FIG. 6 is an exemplary detailed diagram of the controller shown in FIG. 1. As shown in FIG. 4, the controller 520 may include a processor 521, a light source circuit or routine 522, an interface 523, a memory 524 and an output device circuit or routine 525. The controller 520 may include more or less elements without departing from the spirit and scope of the invention. The elements 521-525 may be connected through a bus 528 which communicate with each other using the interface 523.

In the illustrated embodiment, the controller 520 is implemented with general purpose processors. However, it will be appreciated by those skilled in the art that the controller 520 may be implemented using a single special purpose integrated circuit (e.g., ASIC) having a main or central processor section for overall, system-level control, and separate sections dedicated to performing various different specific computations, functions and other processes under control of the central processor section. The controller 520 may be a plurality of separate dedicated or programmable integrated or other electronic circuits or devices (e.g., hardwired electronic or logic circuits such as discrete element circuits, or programmable logic devices such as PLDs, CPLDs, FPGAs, PLAs, PALs or the like).

The controller 520 may be suitably programmed for use with a general purpose computer, e.g., a microprocessor, microcontroller or other processor device (CPU or MPU), either alone or in conjunction with one or more peripheral (e.g., integrated circuit) data and signal processing devices. In general, any device or assembly of devices on which a finite state machine capable of implementing the procedures described herein may be used as the controller 520. A distributed processing architecture may be used for maximum data/signal processing capability and speed. The controller 520 may control the light source circuit or routine 522 to illuminate the object as discussed above. The memory 524 may be any storage device (which may include large databases shared in a variety of memory types such as disks, tapes, RAM, etc.).

In various exemplary embodiments, a ground time constant may be adjusted, for example, to 1.0 μs. This time constant may determine the speed at which the array can be read out. Thus, added flexibility of the tuning the time constant for a particular application may be a feature of various embodiments of the invention. Moreover, a self-aligned TFT may be used to further reduce the data line capacitance and leave the cross-over capacitance as the dominant contribution. In various exemplary embodiments, the signal-to-noise ratio of the imager can be further improved with this technique.

While the invention has been described in conjunction with exemplary embodiment, these embodiments should be viewed as illustrative, not limiting. Various modifications, substitutes, or the like are possible within the spirit and scope of the invention.

What is claimed is:

1. An imaging system including an alternating pixel arrangement, comprising:
   a plurality of gate lines;
   a plurality of data lines;
   a common ground line maintained at a constant potential;
   a plurality of capacitors; and
   an array of pixels that are alternately arranged so that the common ground line is shared by the plurality of capacitors and shared by at least two rows or columns of pixels.

2. The imaging system of claim 1, further comprising the imaging system being an X-ray imaging system.

3. The imaging system of claim 1, further comprising a sensor that is formed to include a layer of a direct detect photoconductor.

4. The imaging system of claim 1, further comprising the common ground line being disposed parallel to the plurality of gate lines.

5. The imaging system of claim 1, further comprising the plurality of data lines crossing over at least two gate lines and the common ground line within a 2×2 pixel cell.

6. The imaging system of claim 1, further comprising individual pixel areas defined by regions formed by at least two data lines, one of the plurality of gate lines and the common ground line.

7. The imaging system of claim 6, further comprising at least one capacitor disposed in each of the pixel areas, each capacitor connected to the common ground line.

8. The imaging system of claim 1, further comprising the plurality of capacitors and the plurality of gate lines being formed as a first metal layer.

9. The imaging system of claim 8, further comprising the plurality of data lines being formed as a second metal layer.

10. The imaging system of claim 9, further comprising each of the plurality of capacitors being formed by an overlap of the first and second metal layers.

11. A method of forming an array of pixels in an imaging system, comprising:
forming a plurality of gate lines;
forming a plurality of data lines;
forming a common ground line maintained at a constant potential;
forming a plurality of capacitors; and
forming the array of pixels to be alternately arranged so that the common ground line is shared by the plurality of capacitors and shared by at least two rows or columns of pixels.

12. The method of claim 11, further comprising the imaging system being an X-ray imaging system.

13. The method of claim 11, further comprising forming a sensor to include a layer of a direct detect photoconductor.

14. The method of claim 11, further comprising forming the common ground line to be disposed parallel to the plurality of gate lines.

15. The method of claim 11, further comprising forming the plurality of data lines to cross over at least two gate lines and the common ground line within a 2×2 pixel cell.

16. The method of claim 11, further comprising forming individual pixel areas to be defined by regions formed by at least two data lines, one of the plurality of gate lines and the common ground line.

17. The method of claim 16, further comprising forming at least one capacitor to be disposed in each of the pixel areas, and forming each capacitor to be connected to the common ground line.

18. The method of claim 11, further comprising forming the plurality of capacitors and the plurality of gate lines being formed as a first metal layer.

19. The method of claim 18, further comprising forming the plurality of data lines being formed as a second metal layer.

20. The method of claim 18, further comprising forming each of the plurality of capacitors at an overlap of the first and second metal layers.

* * * * *